United States Patent
Ito (10) Patent No.: US 9,589,886 B2
(45) Date of Patent: Mar. 7, 2017

(54) SEMICONDUCTOR DEVICE, METHOD OF MANUFACTURING THEREOF, CIRCUIT BOARD AND ELECTRONIC APPARATUS

(71) Applicant: Seiko Epson Corporation, Tokyo (JP)

(72) Inventor: Haruki Ito, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/791,859

(22) Filed: Jul. 6, 2015

(65) Prior Publication Data

US 2015/0311155 A1    Oct. 29, 2015

Related U.S. Application Data

(60) Continuation of application No. 14/469,752, filed on Aug. 27, 2014, which is a continuation of application
(Continued)

(30) Foreign Application Priority Data

Dec. 17, 2003   (JP) .................. 2003-419406

(51) Int. Cl.
*H01L 23/522* (2006.01)
*H01L 23/31* (2006.01)
(Continued)

(52) U.S. Cl.
CPC ...... *H01L 23/5226* (2013.01); *H01L 23/3114* (2013.01); *H01L 23/49816* (2013.01);
(Continued)

(58) Field of Classification Search
CPC . H01L 23/5226; H01L 23/5329; H01L 24/13; H01L 24/14; H01L 24/17;
(Continued)

(56) References Cited

U.S. PATENT DOCUMENTS 6,204,564 B1   3/2001   Miyata et al.
6,333,565 B1   12/2001  Hashimoto
(Continued)

FOREIGN PATENT DOCUMENTS

EP    0917195 A1   5/1999
EP    1198003 A1   4/2002
(Continued)

OTHER PUBLICATIONS

European Search Report for Application No. 04 02 9836 dated Oct. 7, 2011 (3 pages).

*Primary Examiner* — Michelle Mandala
(74) *Attorney, Agent, or Firm* — Harness, Dickey & Pierce, P.L.C.

(57) ABSTRACT

A semiconductor device is provided having a semiconductor element including a plurality of electrodes; first wirings coupled to the electrodes and directed toward a center of the semiconductor element from a portion coupled to the electrodes; second wirings coupled between the first wirings and external terminals, the second wirings being directed to an outer area of the semiconductor element relative to the center; and at least one resin layer formed between the first wirings and the second wirings.

8 Claims, 6 Drawing Sheets

Related U.S. Application Data

No. 13/908,531, filed on Jun. 3, 2013, now Pat. No. 8,847,406, which is a continuation of application No. 13/156,686, filed on Jun. 9, 2011, now Pat. No. 8,482,121, which is a continuation of application No. 12/569,478, filed on Sep. 29, 2009, now Pat. No. 7,982,310, which is a division of application No. 11/016,504, filed on Dec. 17, 2004, now Pat. No. 7,615,864.

(51) Int. Cl.
*H01L 23/498* (2006.01)
*H01L 23/00* (2006.01)
*H01L 23/532* (2006.01)

(52) U.S. Cl.
CPC .......... *H01L 23/5329* (2013.01); *H01L 24/13* (2013.01); *H01L 24/14* (2013.01); *H01L 24/17* (2013.01); *H01L 2224/02331* (2013.01); *H01L 2224/13014* (2013.01); *H01L 2224/14131* (2013.01); *H01L 2224/16225* (2013.01); *H01L 2924/0002* (2013.01); *H01L 2924/013* (2013.01); *H01L 2924/014* (2013.01); *H01L 2924/01022* (2013.01); *H01L 2924/01029* (2013.01); *H01L 2924/01074* (2013.01); *H01L 2924/186* (2013.01)

(58) Field of Classification Search
CPC ........... H01L 23/49816; H01L 23/3114; H01L 2224/02331; H01L 2224/14131; H01L 2924/01029; H01L 2924/014; H01L 2924/013; H01L 2224/1622; H01L 2924/0002; H01L 2924/00
See application file for complete search history.

(56) References Cited

U.S. PATENT DOCUMENTS

| | | | |
|---|---|---|---|
| 6,396,148 B1 | 5/2002 | Eichelberger et al. | |
| 6,441,493 B1 | 8/2002 | Kim | |
| 6,515,372 B1 | 2/2003 | Narizuka et al. | |
| 6,608,389 B1 | 8/2003 | Hashimoto | |
| 6,621,154 B1 | 9/2003 | Satoh et al. | |
| 6,707,153 B2 | 3/2004 | Kuwabara et al. | |
| 6,781,224 B2 | 8/2004 | Yoneda et al. | |
| 6,841,875 B2* | 1/2005 | Ohsumi | H01L 23/3114 257/737 |
| 7,129,581 B2 | 10/2006 | Ito | |
| 7,183,189 B2 | 2/2007 | Hashimoto | |
| 7,851,265 B2 | 12/2010 | Ito | |
| 7,982,310 B2* | 7/2011 | Ito | H01L 23/3114 257/736 |
| 8,847,406 B2* | 9/2014 | Ito | H01L 23/3114 257/736 |
| 8,946,892 B2* | 2/2015 | Kim | H01L 23/49822 174/260 |
| 9,105,534 B2* | 8/2015 | Ito | H01L 23/3114 |
| 2001/0015496 A1 | 8/2001 | Watase et al. | |
| 2001/0026021 A1 | 10/2001 | Honda | |
| 2002/0037643 A1 | 3/2002 | Ishimaru | |
| 2003/0148558 A1 | 8/2003 | Kubo et al. | |
| 2003/0155652 A1 | 8/2003 | Murata et al. | |
| 2003/0160325 A1* | 8/2003 | Yoneda | H01L 21/4846 257/758 |
| 2003/0162386 A1 | 8/2003 | Ogawa et al. | |
| 2003/0213981 A1 | 11/2003 | Hashimoto | |
| 2004/0124529 A1 | 7/2004 | Hanaoka | |
| 2004/0201097 A1* | 10/2004 | Ohsumi | H01L 23/3114 257/737 |
| 2005/0017271 A1* | 1/2005 | Rokugawa | H01L 23/49811 257/202 |

FOREIGN PATENT DOCUMENTS

| | | |
|---|---|---|
| JP | 2000-323604 A | 11/2000 |
| JP | 2002-118205 A | 4/2002 |
| JP | 2002-329809 A | 11/2002 |
| WO | WO-9825297 A1 | 6/1998 |
| WO | WO-9825298 A1 | 6/1998 |
| WO | WO-0055898 A1 | 9/2000 |

* cited by examiner

SEMICONDUCTOR DEVICE, METHOD OF MANUFACTURING THEREOF, CIRCUIT BOARD AND ELECTRONIC APPARATUS

CROSS-REFERENCE TO RELATED APPLICATIONS

This is a continuation application of U.S. Ser. No. 14/469,752 filed Aug. 27, 2014, which is a continuation application of U.S. Ser. No. 13/908,531 filed Jun. 3, 2013, now U.S. Pat. No. 8,847,406 issued Sep. 30, 2014, which is a continuation application of U.S. Ser. No. 13/156,686 filed Jun. 9, 2011, now U.S. Pat. No. 8,482,121 issued Jul. 9, 2013, which is a continuation application of U.S. Ser. No. 12/569,478 filed Sep. 29, 2009, now U.S. Pat. No. 7,982,310 issued Jul. 19, 2011, which is a divisional application of U.S. Ser. No. 11/016,504 filed Dec. 17, 2004, now U.S. Pat. No. 7,615,864 issued Nov. 10, 2009, which claims priority to Japanese Patent Application No. 2003-419406 filed Dec. 17, 2003 all of which are hereby expressly incorporated by reference herein in their entireties.

BACKGROUND

Technical Field

The present invention relates a semiconductor device, a method of manufacturing, a circuit substrate and an electronic apparatus. In particular, the invention relates to a semiconductor device and a method of manufacturing there same having highly reliable connections, a circuit substrate and an electronic apparatus in which the semiconductor device is installed.

Related Art

To mount a semiconductor device with high density, it is preferable to mount a semiconductor chip as it is without packaging such as bare chip mounting. In bare chip mounting, however, insufficient protection is provided for a semiconductor chip and it is hard to handle. Hence, a semiconductor device using a chip size package (CSP) is proposed and a wafer level CSP in which a diced wafer becomes a semiconductor device without modification has been recently developed. In this wafer level CSP, resin layers and wirings are formed on a surface of a silicon wafer in which tiny transistors are fabricated. This silicon wafer is cut into individual semiconductor devices so as to yield a semiconductor device.

In the conventional method of manufacturing a semiconductor device using a wafer level CSP, when a resin layer is formed on a surface of a silicon wafer, the resin layer is not formed in a portion which is diced (i.e., cut) so as to avoid the loosening of a resin layer and the cracking of an end area of a semiconductor device (see International Patent Publication No. 01-071805 pamphlet (FIG. 1 and FIG. 14)).

In the conventional method of manufacturing a semiconductor device using a wafer level CSP, however, a resin layer and an external terminal are formed close to the center of a semiconductor element and the external terminal is connected to wiring extending from an electrode formed in a circumferential part of the semiconductor device. In this case, there is a problem in that a portion of the wiring connected to the external terminal is easily disconnected by stress and the like applied to the semiconductor device if the wiring extends in the center direction of a semiconductor element from the electrode and is directly connected to the external terminal. In particular, in the case of wafer level CSP, a portion for forming the external terminal of a wiring (called a land) is large and the root of this land may become disconnected.

Further, in the conventional method of manufacturing a semiconductor device using a wafer level CSP, there is another problem in that the root of the land formed in the circumferential part of a semiconductor device is easily disconnected due to the large stress at the areas remote from the center of the semiconductor device if the chip size is large. In the conventional method of manufacturing a semiconductor device, there is a further problem in that a wiring extends from the surface of a semiconductor device in which electrodes are formed to the surface of a resin layer so as to form a step in the wiring which makes it difficult to provide fine wiring.

The present invention aims to provide a semiconductor device, which can correspond to a large size chip and be provided with many external terminals with fine wirings with highly reliable connections. Further, the invention aims to provide a method of manufacturing the semiconductor device, and a circuit substrate and an electronic apparatus in which the semiconductor device with highly reliable connections is installed.

SUMMARY

A semiconductor device of the present invention comprises: a semiconductor element including a plurality of electrodes; first wirings coupled to the electrodes and directed toward a center of the semiconductor element from a portion coupled to the electrodes; second wirings coupled between the first wirings and external terminals, the second wirings being directed toward an outer area of the semiconductor element relative to the center; and at least one resin layer formed between the first and second wirings. As such, stress is effectively relaxed since a longitudinal section of the wiring is a U-shape. Further, parts connecting the wirings to the external terminals are placed in the center of the semiconductor device so that disconnection of the part connecting the wirings to the external terminals can be avoided even if stress is applied to the semiconductor device. Further, the at least one resin layer is formed between the first wirings and the second wirings so as to relax a stress applied to the wirings and cope with the large stress associated with a large size chip. Further, the first wirings are not formed on a resin layer and therefore no step is formed which enables fine wiring and many external terminals to be formed.

In the semiconductor device of the present invention, the semiconductor device is packaged with a chip size packaging method. As such disconnection of the wirings is effectively avoided.

In the semiconductor device of the present invention, the external terminals may be made of solder balls. A portion of the wirings (called a land) for forming the external terminals is large and the root of this land is prone to disconnection. However, the aforementioned structure of the wirings can prevent the root of the land from disconnecting.

In the semiconductor device of the present invention, a bore hole is installed in the at least of one resin layer so as to connect the first and second wirings. This improves the reliability of the connection.

In the semiconductor device of the present invention, the semiconductor device is manufactured by cutting integrated semiconductor elements made on a silicon wafer by dicing. Thus, the semiconductor device is manufactured by cutting a silicon wafer in which tiny transistors and the like are formed, for example, with dicing so that many semiconductor devices are obtained from a single silicon wafer.

In the semiconductor device of the present invention, the at least one resin layer is spaced apart from a portion of the silicon wafer to be cut during dicing. This avoids cracking of an end area of a semiconductor device and the loosening of the resin layer.

In the semiconductor device of the present invention, the at least one resin layer is formed in a region in which the electrodes are formed. The resin layer formed between the first wirings and the second wirings is also formed in a region in which the electrodes are formed, for example, so that an area for forming external terminals can be expanded and many eternal terminals can be formed.

In a method of manufacturing a semiconductor device including a semiconductor element having a plurality of electrodes; a resin layer; wirings; and a plurality of external terminals connected to the wirings, the method comprises: forming first wirings directed to a center of the semiconductor element from a portion coupled to the electrodes; forming at least one resin layer; and forming second wirings directed to an outer area of the semiconductor element relative to the center and coupled between the first wirings and the external terminals. In this way, a longitudinal section of the wirings is a U-shape to effectively relax the stress. Further, a part connecting the wirings to the external terminals is placed in the center of a semiconductor device so that disconnection of the part connecting the wirings to the external terminals can be avoided even if stress is applied to the semiconductor device. Further, the at least one resin layer is formed between the first wirings and the second wirings to relax stress applied to the wirings and cope with the large stress associated with a large size chip.

Further, the first wirings are not formed on a resin layer and no step is formed so as to enable fine wirings and many external terminals to be formed.

In the method of manufacturing a semiconductor device of the present invention, the semiconductor device is packaged with a chip size packaging method.

The above-described structure is applied to the wirings in the semiconductor device packaged with a CSP method so as to effectively avoid disconnection of the wirings.

In the method of manufacturing a semiconductor device of the present invention, the external terminals may be made of solder balls.

In the method of manufacturing a semiconductor device of the present invention, the first and second wirings may be connected via a through hole formed in the resin layer.

In the method of a semiconductor device of the present invention, the semiconductor device may be cut from a silicon wager including integrated semiconductor elements.

In the method of a semiconductor device of the present invention, the at least one resin layer is spaced apart from a portion of the silicon wafer to be cut.

This avoids cracking an end area of a semiconductor device and the loosening of a resin layer.

In the method of manufacturing a semiconductor device of the present invention, the at least one resin layer is formed in a region in which the electrodes are formed.

The resin layer formed between the first wirings and the second wirings is also formed in a region in which the electrodes are formed for example so that an area for forming external terminals can be expanded and many eternal terminals can be formed.

In a circuit board of the present invention, the above mentioned semiconductor device is installed.

An electronic apparatus of the invention is provided with any of the above semiconductor devices so as to attain highly reliable connections.

DETAILED DESCRIPTION

First Embodiment

Figure 1:
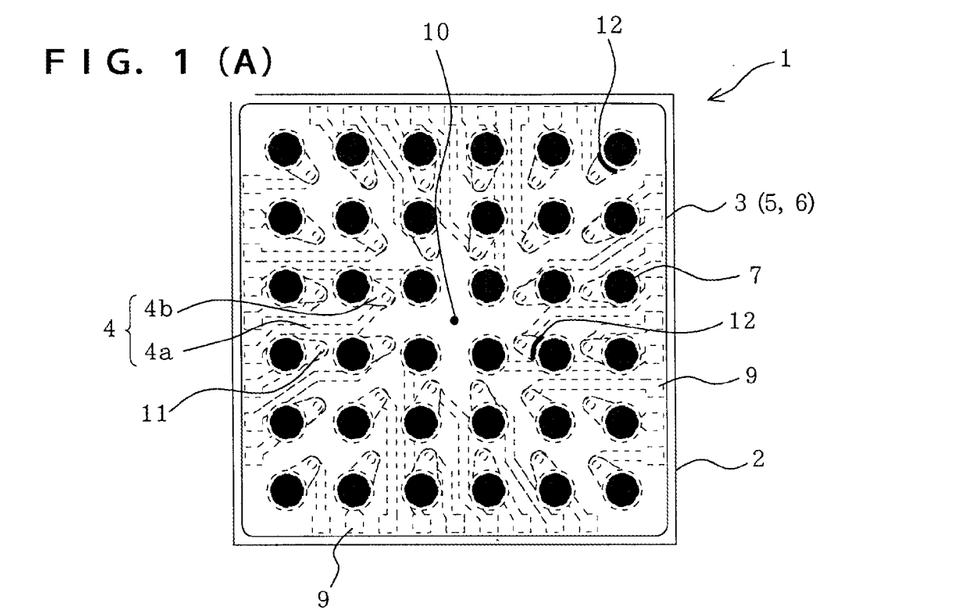
FIGS. 1A-B are a plan view and a longitudinal sectional view a first embodiment of the invention.

FIG. 1 is an plan view and a longitudinal sectional view a first embodiment of the invention. Here, FIG. 1A is an example of the semiconductor device according to embodiment 1 and some parts are illustrated as being transparent.

The semiconductor device 1 of embodiment 1 mainly comprises a first resin layer 3, wirings 4, a second resin layer 5, a third resin layer 6 and external terminals 7 on one surface of a semiconductor element 2.

As shown in FIG. 1, the wirings 4 comprise first wirings 4a and second wirings 4b. A resin layer 3 is formed between the first wirings 4a and the second wirings 4b. A passivation film 8 made of a insulation material and electrodes 9 is formed on one surface of the semiconductor element 2 and the first wirings 4a are formed on the surface of the passivation film 8.

A plurality of the electrodes 9 and a plurality of the wirings 4 are electrically connected to each other. Namely, each of the wirings 4 is electrically coupled to an external terminal 7 which are therefore electrically coupled to the electrodes 9.

Here, in general, a second resin layer 5 is formed for protecting the wirings 4 and the external terminals 7. However, the second resin layer 5 is not necessarily needed. Further, in embodiment 1, a third resin layer 6 is formed for reinforcing the root of each external terminal 7. However, the third resin layer 6 is not necessarily needed.

In the semiconductor element 2, many tiny transistors and others are formed by pre-processing a silicon wafer. The first resin layer 3 and the external terminals 7 are formed on the silicon wafer and the silicon wafer is thereafter cut by dicing to form the semiconductor device 1. Thus, a diced part of the silicon wafer becomes the semiconductor device without further modification. This is called wafer level CSP. Wafer level CSP is a kind of a packaging method known as CSP but further advances miniaturization as compared to conventional (i.e., non "wafer level") CSP. In embodiment 1, silicon (mainly mono crystalline) is used as the semiconductor device 2. However, other semiconductor materials such as gallium arsenide and the like can be used.

The thin passivation film 8 and the electrodes 9 made of aluminum and the like are formed on one surface of the semiconductor element 2 and the first wirings 4a and the first resin layer 3 are formed on the surface of the passivation film 8. In embodiment 1, a plurality of electrodes 9 are placed along the circumference (i.e., the circumferential region) of the semiconductor element 2 and the first resin layer 3 is also formed on some of the electrodes 9. Thus, forming the first resin layer 3 can expand a region for forming the external terminals 7 and enables many external terminals 7 to be formed. Further, the first resin layer 3 is not formed all the way to the outer circumference of the semiconductor element 2. As the material for the first resin layer 3, at least polyimide resin, silicon denaturation of polyimide resin, epoxy resin, silicon denaturation of epoxy resin, phenolic resin, acrylic resin, benzocyclobutene (BCB) and poly benzoxazole (PBO) may be used.

As described above, the wirings 4 comprise the first wirings 4a and the second wirings 4b. The first wirings 4a are formed on the surface of the passivation film 8 so as to be connected to the electrodes 9 on the semiconductor element 2. The first wirings 4a are formed for every electrode 9 and ends for connecting to the electrodes 9 is a first land (explained in a second embodiment of the present invention in detail). The first wirings 4a are made of multi layers including a layer of a titanium and tungsten alloy and a layer of copper. As shown in FIG. 1A, the first wirings 4a are formed to be directed toward the center 10 of the semiconductor element 2 from the portion connected to the electrodes 9. The center 10 is easy to determine in the case of a quadrate shaped semiconductor element 2 as shown in FIG. 1A. However, in the case of a rectangular semiconductor element 2, the center 10 is located at a position which divides a longitudinal direction and transverse direction substantially into a 50:50 ratio. In the case of other shapes, the center 10 is located at the gravitational center.

In embodiment 1, the first wirings 4a are formed on the surface of the passivation film 8. It is preferable that another resin film is formed, for example, between the first wirings 4a and the semiconductor element 2.

The second wirings 4b are coupled to the first wirings 4a via a second bore hole 11. In embodiment 1, the second wirings 4b are formed on the surface of the first resin layer 3 and the first resin layer 3 is formed between the first wrings 4a and the second wirings 4b. However, it is preferable that a plurality of resin layers be formed and another material is interposed between the first wirings 4a and the second wirings 4b. The second wirings 4b are connected to the external terminals 7 and are directed toward the outboard area of the semiconductor element 2 relative to the center 10. At an end of a portion of the wirings 4b connected to the first wirings 4a is a second land (explained in a second embodiment in detail) for coupling that portion to the external terminals 7.

In the first embodiment 1, the second wirings 4b connected to the external terminals 7 that are formed close to the center 10 of the semiconductor element 2, are not connected to the external terminals 7 as they proceed to the outboard area from the center 10 of the semiconductor element 2. Further, in embodiment 1, as shown in FIG. 1B, the second wirings 4b are formed within the internal wall of the bore holes 11. However, the first wirings 4a may be formed within the internal wall of the bore holes 11.

Figure 2:
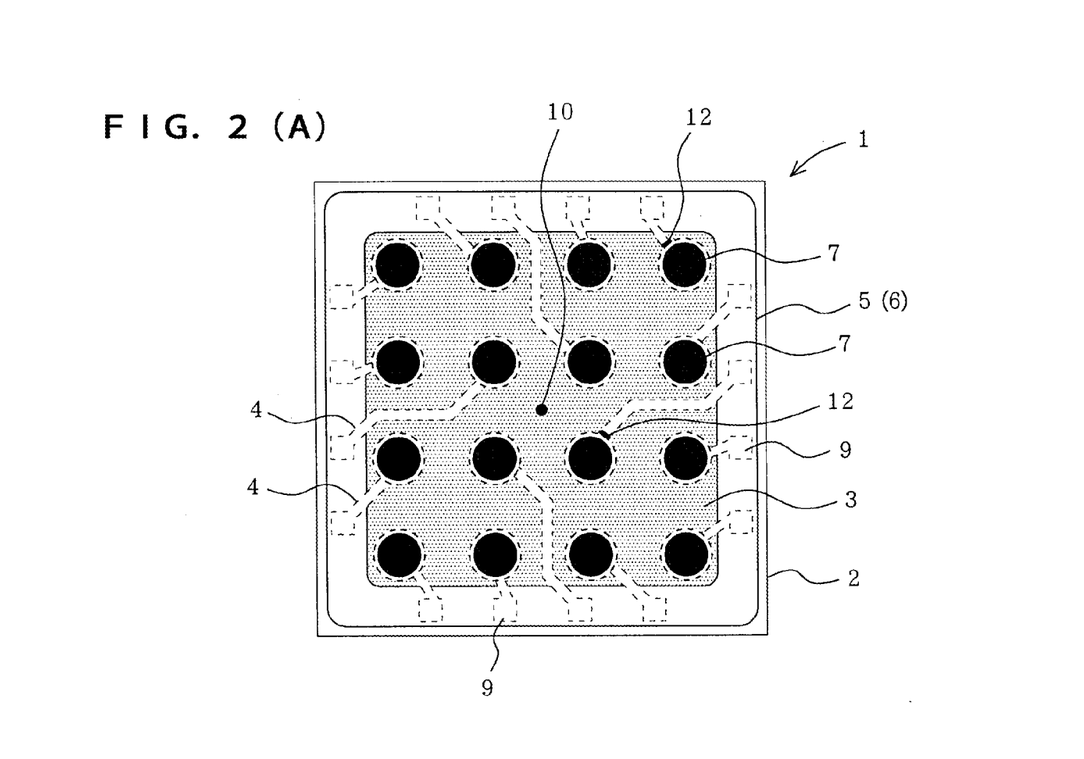
FIGS. 2A-B are a plan view and a longitudinal sectional view showing a semiconductor device in which the wiring having a structure of the first embodiment 1 is not used.

FIG. 2 is a plan view and a longitudinal sectional view showing a semiconductor device in which wiring having the structure of the first embodiment 1 is not used. Here, in FIG. 2A, some parts are made transparent similar to FIG. 1A. FIG. 2B shows two external terminals 7 which are located parallel to each other for convenience and the same reference numbers as in FIG. 1 are applied to the same portions in this figure.

In the semiconductor device 1 shown in FIG. 2, the wirings 4 comprise a single portion instead of two portions such as the first wirings 4a and the second wirings 4b. The wirings 4 are formed on the surface of the first resin layer 3 and extend toward the center 10 of the semiconductor element 2 from the electrodes 9 and are connected to the external terminals 7 as they proceed from the outboard region to the center 10.

A large stress is applied to the semiconductor device 1 shown in FIG. 1 and FIG. 2 farther away from the center 10 due to warpage and the like. As shown in FIG. 2, the wirings 4 are connected to the external terminals 7 directed to the center 10 of the semiconductor element 2 from outside the external terminals 7 and the connecting portions 12 of the wirings 4 are placed far from the center 10 so as to receive a large stress. Hence, in the conventional semiconductor device 1 shown in FIG. 2, there disconnections occur at the connecting portions 12. Further, the wirings 4 connected to the external terminals 7 located far from the center 10 have a short length so that part of the connecting portions 12 is easily disconnected. In contrast, in the semiconductor device 1 of embodiment 1 (see FIG. 1), the first wirings 4a and the second wirings 4b are formed and the second wirings 4b are connected to the external terminals 7 as directed to the outer area from the center 10 of the semiconductor element 2 so as to avoid disconnection of the connecting portions 12.

Here, the structure of the semiconductor device 1 according to embodiment 1 shown in FIG. 1 is reviewed. The second resin layer 5 is formed on the surface of the semiconductor element 2 including the first wiring 4a, the first resin layer 3 and the second wiring 4b. The second resin layer 5, however, is not formed all the way to the outer circumference of the semiconductor element 2 and a region (a second land explained in embodiment 2 in detail) where the external terminals 7 of the second wirings 4b are formed. The second resin layer 5 is not formed in the outer circumstantial region of the semiconductor element 2 to avoid cracking an end area of the semiconductor device 1 and loosening of a resin layer by being spaced apart from the area to be cut during dicing when the semiconductor element 2 is cut from a silicon wafer. As the material for the second resin layer 5, the same material as for the first resin layer 3 may be used or a different material may be used.

The external terminals 7 may be made of solder balls formed on the second lands 2 (explained in the second embodiment in detail) at the end of the second wirings 4b. The external terminals 7 are used for connecting the semiconductor device 1 to a circuit board and may be made of a lead-free solder, for example.

Further, the third resin layer 6 may be formed on the surface of the second resin layer 5. The third resin layer 6 is formed mainly for reinforcing the external terminals 7 so that a circumferential area of the external terminals 7 is slightly sloped. Further, the third resin layer 6 is formed to expose a part of each external terminal 7. Here, as the material for the third resin layer 6, the same material as for the first resin layer 3 may be used or a different material may be used.

It is preferable that the elasticity of each of the first resin layer 3, the second resin layer 5 and the third resin layer 6 is lower in this order. Thus, resin layers having a lower elasticity are formed in order from the semiconductor element 2 to the external terminals 7 to effectively relax stress such as warpage.

In embodiment 1, a part of or all of the plurality of wirings 4 comprise the first wirings 4a directed to the center 10 of the semiconductor element 2 from a portion coupled to the electrodes 9 and the second wirings 4b which are directed to an outer area from the center 10 of the semiconductor element 2 and coupled to the external terminals 7 so as to make the longitudinal cross section of the wirings 4 a U-shape for relaxing a stress. Further, a part connecting the second wirings 4b to the external terminals 7 is placed in the center of the semiconductor device 2 so that disconnection of the part connecting the second wirings 4b to the external terminals 7 can be avoided even if a stress is applied to the semiconductor device 1. Further, the first resin layer 3 is formed between the first wirings 4a and the second wirings 4b so as to relax stress applied to the wirings 4 and cope with large stresses associated with a large size chip.

Further, the first wirings 4a are not formed on a resin layer and therefore no step is formed which enables fine wiring and many external terminals 7 to be formed.

Second Embodiment

Figure 3:
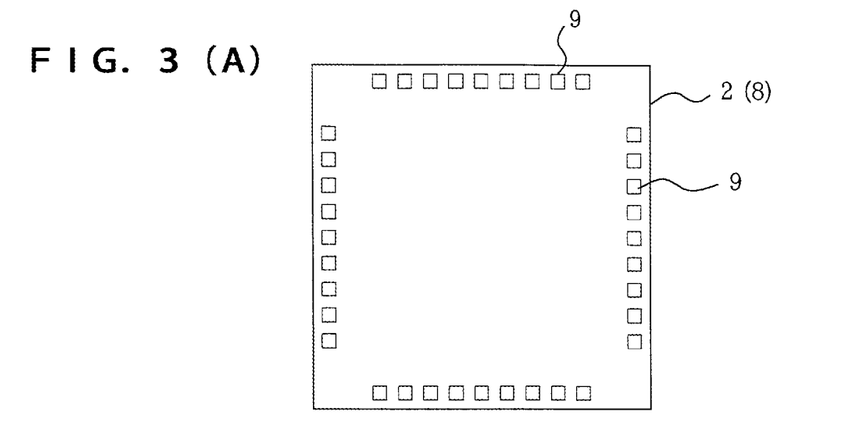
FIGS. 3A-C are plan views of the process for manufacturing a semiconductor device of a second embodiment of the invention.
Figure 4:
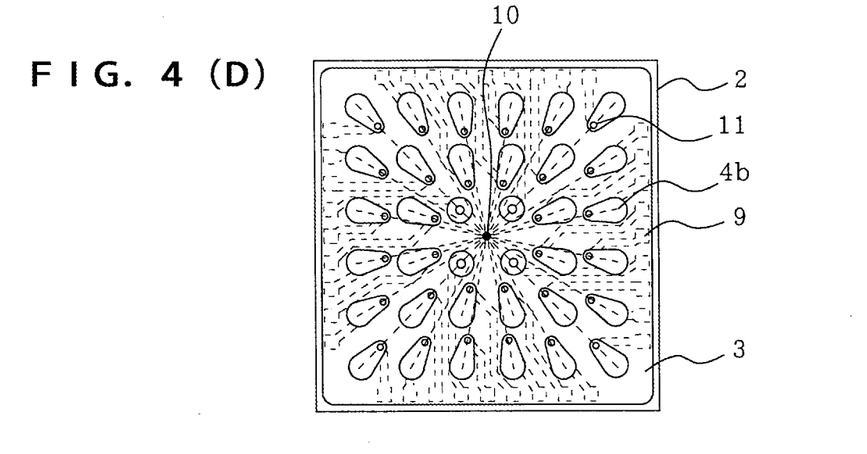
FIGS. 4D-F are plan views showing a continued process followed by FIG. 3 for manufacturing a semiconductor device.
Figure 5:
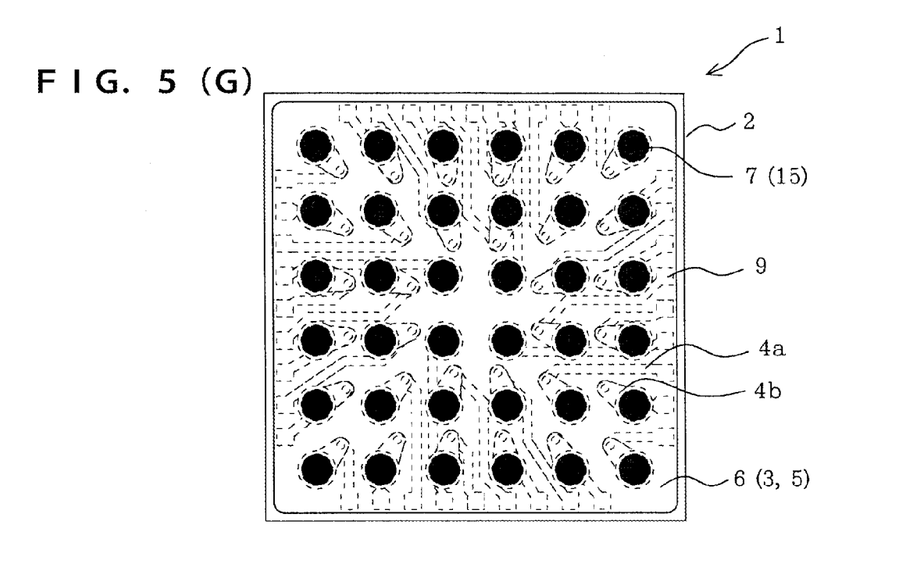
FIG. 5G is a plan view showing a continued process followed by FIG. 4 for manufacturing a semiconductor device.

FIGS. 3, 4 and 5 are a partial plan view and partial longitudinal cross section showing manufacturing process for a semiconductor device of embodiment 2 of the invention.

Here, the manufacturing method shown in embodiment 2 is to manufacture the semiconductor device 2 shown in embodiment 1. In FIGS. 3, 4 and 5, the second resin layer 5 and the third resin layer 6 are illustrated as being transparent similar to FIG. 1A. FIGS. 3, 4 and 5 show only a part corresponding to the semiconductor device 1 which is one of a silicon wafer as an integration of the semiconductor element 1.

First, the passivation film 8 and the electrodes 9 are formed on a silicon wafer provided with many tiny transistors via pre-processing (FIG. 3A.) The passivation film 8 is formed in an area except a portion for the electrodes 9 on a side surface of the semiconductor element 2. Electrodes 9 are formed along the outer circumference of the semiconductor element 2.

Then, a plurality of the first wirings 4a are coupled to the electrodes 9 on the semiconductor element 2. The first wirings 4a are formed as directed to the center 10 of the semiconductor element 2 from a portion of connecting the first wirings 4a to the electrodes 9. The ends of the first wirings 4a include the first lands 14 which will be coupled to the second wirings 4b later. By making the first lands 14 relatively small, forming many external terminals 7 is possible so as to restrain disconnection of the roots of the first lands 14. The first wirings 4a are formed by forming a titanium and tungsten alloy layer and a copper layer on the surface of the passivation film 8 with sputtering for example, thereafter coating a resist film with a predetermined shape (not shown), leaving the alloy layer and copper layer in the area for the first wirings 4a by etching, and then removing the resist layer.

Further, the first resin layer 3 is formed on the surface of the passivation film 8 on which the wirings 4a have been formed during the process of FIG. 3B (see FIG. 3C.). At this time, the first resin layer 3 is also formed on a part of the first wirings 4a and electrodes 9. Thus, forming the first resin layer 3 on a part of the electrodes 9 can expand a region for forming the external terminals 7 and enables many external terminals 7 to be formed. Bore holes 11 are formed in a part of each first land 14 of the resin layer 3 and the first wirings 4a can be coupled to the electrodes 9 thereby.

Thereafter, the second wirings 4b are formed on the surface of the first resin layer 3 (FIG. 4D). The second wirings 4b are formed as to be connected to the first wirings 4a via the bore holes 11 and directed to the outer area from the center 10 of the semiconductor element 2. The second wirings 4b may be also formed by the same process as for the first wirings 4a for example. However, it is preferable that copper plating be added over the titanium and tungsten alloy layer and the copper layer.

The second resin layer 5 is formed on the surface of the first resin layer 3 and the second wirings 4b (FIG. 4E). At this time, the second resin layer 5 is not formed all the way to the outer circumference of the semiconductor element 2 as described above and an end of the second wirings 4b on the side of the bore holes 11. The end of the second wirings 4b on the side of the bore holes 11 include the second lands 15 in which the external terminals 7 will be formed. The second lands 15 are preferably formed having a larger area than that of the first lands 14.

Further, the external terminals 7 made of solder balls are formed in the second lands 15 (FIG. 4F). The external terminals 7 are made of lead free solder, for example, and formed by solder ball transferring, paste printing and plating.

Further, the third resin layer 6 is formed on the surface of the second resin layer 5 (FIG. 5G). In this case, the third resin layer 6 is formed to expose a part of the external terminals 7. However, the third resin layer 6 is not necessarily need.

Finally, after completing the manufacturing processes shown in FIG. 4F and through FIG. 5G, the silicon wafer is cut by dicing so as to form an individual semiconductor device 1. In the above manufacturing processes, the first resin layer 3 and the second resin layer 5 are not formed in the area in which a silicon wafer as an integration of the semiconductor element 2 is diced so that these resin layers are not cut to avoid cracking the end of the semiconductor element 2 and removing these resin layers.

In embodiment 2, a part of or all of the plurality of wirings 4 comprise the first wirings 4a directed to the center 10 of the semiconductor element 2 from a portion coupled to the electrodes 9 and the second wirings 4b which are directed to an outer area from the center 10 of the semiconductor element 2 and coupled to the external terminals 7 so as to make the longitudinal cross section of the wiring 4 a U-shape for relaxing stress. Further, a part connecting the second wirings 4b to the external terminals 7 is placed in the center of the semiconductor device 2 so that disconnection of the part connecting the second wirings 4b to the external terminals 7 can be avoided even if stress is applied to the semiconductor device 1. Further, the first resin layer 3 is formed between the first wirings 4a and the second wirings 4b so as to relax stress applied to the wirings 4 and cope with the large stress associated with a large size chip.

Other advantages in the embodiment are the same as in the semiconductor device according to the first embodiment.

Third Embodiment

Figure 6:
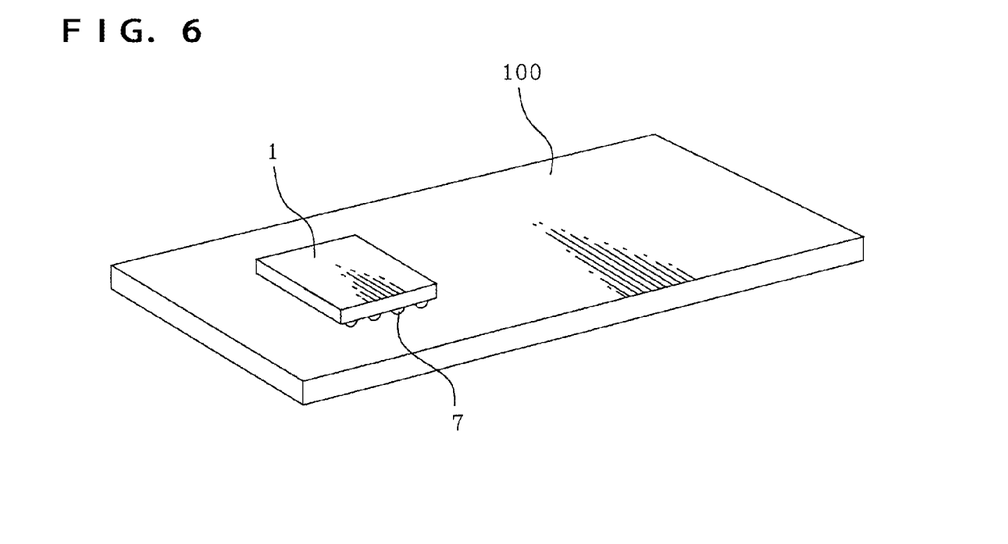
FIG. 6 is a perspective view schematically showing an example of a circuit board according to a third embodiment of the invention.

FIG. 6 is a perspective view schematically showing an example of a circuit board according to a third embodiment of the invention. In the circuit board 100 shown in FIG. 6, the semiconductor device according to the first embodiment of the invention is mounted. The circuit board 100 is made of a glass epoxy substrate and wiring patterns such as copper and others are formed in advance. The external terminals 7 of the semiconductor device 1 are connected to the circuit board 100 so as to be electrically conducted and perform a predetermined processing (data processing for example).

Figure 7A:
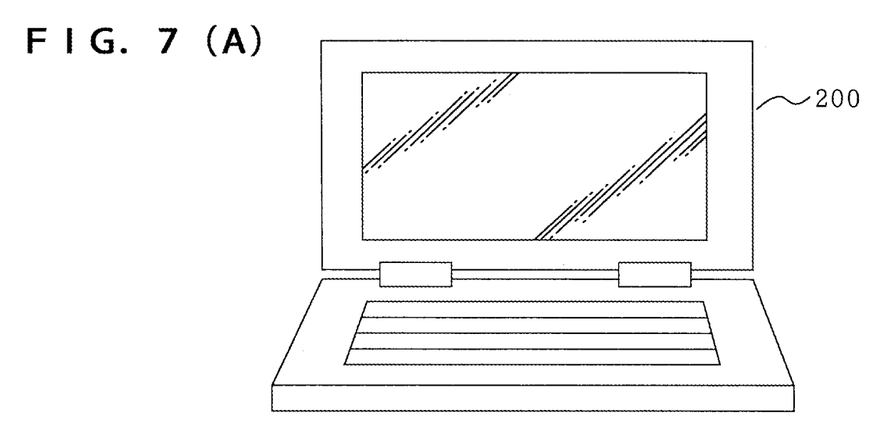
FIGS. 7A-B are examples of electronic apparatus according to a third embodiment of the invention.
Figure 7B:
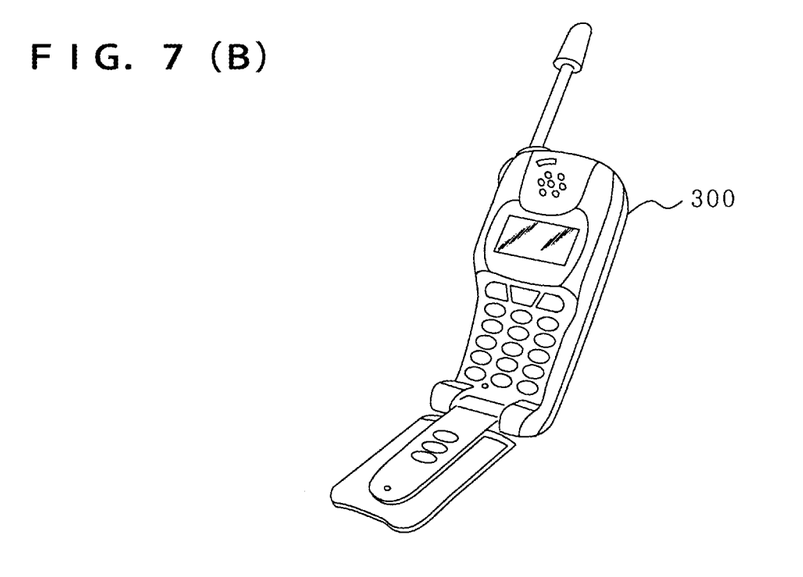

FIG. 7 is an example of an electronic apparatus according to a third embodiment of the invention. The electronic apparatus shown in FIG. 7 has the semiconductor device 1 according to the first embodiment of the invention. FIG. 7A shows an example in which the semiconductor device 1 is applied to a personal computer 200 and FIG. 7B is an example in which the semiconductor device 1 is applied to a cellar phone 300. The semiconductor device 1 shown in the first embodiment 1 and the semiconductor device 1 shown the manufacturing method of the second embodiment 2 can be applied to other electronic devices.

What is claimed is:

1. A semiconductor device comprising:
   a substrate having a center and a plurality of edges spaced apart from the center;
   an electrode that is disposed over the substrate;
   a first wiring that is disposed over the substrate and electrically connected to the electrode, the first wiring extending, in a plan view of the substrate, in a first direction from one of the edges to the center;
   an insulating layer that is disposed over the first wiring;
   a second wiring that is disposed over the insulating layer and electrically connected to the first wiring through a hole in the insulating layer, the second wiring extending, the plan view of the substrate, in a second and non-overlapping direction from the center back towards the one edge; and
   a terminal that is disposed over the second wiring and directly electrically connected to the second wiring;
   wherein an angle between the first wiring and the second wiring is 90 degrees or less in the plan view of the substrate; and
   wherein the angle of a part of the first wiring and a part of the second wiring adjacent to the hole is acute in the plan view.

2. The semiconductor device according to claim 1, the electrode that is disposed over a circumference of the substrate.

3. The semiconductor device according to claim 1, wherein the insulating layer contains a resin.

4. The semiconductor device according to claim 1, wherein the hole is at a vertex of the angle.

5. The semiconductor device according to claim 1, further comprising:
   a second insulating layer that is disposed so as to cover the first wiring and the second wiring.

6. The semiconductor device according to claim 1, wherein the second insulating layer contains a resin.

7. An electronic apparatus comprising the semiconductor device according to claim 1.

8. A semiconductor device comprising:
   a substrate having a center and a plurality of edges spaced apart from the center;
   an electrode that is disposed over the substrate;
   a first wiring that is disposed over the substrate and electrically connected to the electrode, the first wiring extending, in a plan view of the substrate, in a first direction from one of the edges to the center;
   an insulating layer that is disposed over the first wiring;
   a second wiring that is disposed over the insulating layer and electrically connected to the first wiring through a hole in the insulating layer, the second wiring extending, in the plan view of the substrate, in a second and non-overlapping direction from the center back towards the one edge; and
   a terminal that is disposed over the second wiring and directly electrically connected to the second wiring.

* * * * *